(12) United States Patent
Wakchaure et al.

(10) Patent No.: US 9,529,668 B2
(45) Date of Patent: Dec. 27, 2016

(54) METHOD AND SYSTEM FOR USING NAND PAGE BUFFERS TO IMPROVE THE TRANSFER BUFFER UTILIZATION OF A SOLID STATE DRIVE

(71) Applicants: Yogesh B. Wakchaure, Folsom, CA (US); David J. Pelster, Longmont, CO (US); Eric L. Hoffman, Lafayette, CO (US); Xin Guo, San Jose, CA (US); Aliasgar S. Madraswala, Folsom, CA (US)

(72) Inventors: Yogesh B. Wakchaure, Folsom, CA (US); David J. Pelster, Longmont, CO (US); Eric L. Hoffman, Lafayette, CO (US); Xin Guo, San Jose, CA (US); Aliasgar S. Madraswala, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 41 days.

(21) Appl. No.: 14/499,010

(22) Filed: Sep. 26, 2014

(65) Prior Publication Data
US 2016/0092299 A1  Mar. 31, 2016

(51) Int. Cl.
*G06F 11/10* (2006.01)
*G11C 11/56* (2006.01)
(Continued)

(52) U.S. Cl.
CPC ....... *G06F 11/1068* (2013.01); *G06F 11/1072* (2013.01); *G11C 11/5628* (2013.01);
(Continued)

(58) Field of Classification Search
CPC G06F 11/1068; G06F 3/0679; G06F 11/1072; G06F 12/0246; G06F 11/1048; G06F 3/0619; G06F 2212/7201; G06F 3/0688; G06F 2212/222; G06F 2212/2022; G06F 2212/214; G06F 2212/7203; G06F 12/0868; G06F 2003/0691; G06F 2212/202; G06F 2212/403; G06F 3/0656; G06F 11/106; G11C 29/52; G11C 16/0483; G11C 2211/5643; G11C 2211/5641; G11C 29/42; G11C 2211/5648; G11C 11/1072; G11C 2211/5642

(Continued)

(56) References Cited

U.S. PATENT DOCUMENTS 8,819,337 B1 * 8/2014 Oshinsky ............ G06F 11/1441
365/185.07
2005/0237814 A1 * 10/2005 Li ....................... G11C 11/5628
365/185.28

(Continued)

FOREIGN PATENT DOCUMENTS

CN  103714856  4/2014

OTHER PUBLICATIONS

NVM Express, Inc., "NVM Express", Revision 1.1b, Jul. 2, 2014, 172 pp.

(Continued)

*Primary Examiner* — April Y Blair
*Assistant Examiner* — Sazzad Hossain
(74) *Attorney, Agent, or Firm* — Konrad Raynes Davda & Victor LLP; Rabindranath Dutta (57) ABSTRACT

A page data (e.g., upper page data) received from a host is stored in a transfer buffer of a controller of a solid state drive. Another page data (e.g., lower page data) is read from a non-volatile memory (e.g., a NAND memory) to store in the transfer buffer as an error corrected page data. The error (Continued)

corrected page data and the page data are written to the non-volatile memory. In additional embodiments, a controller loads a page data (e.g., upper page data) received from the host in one or more NAND page buffers. The controller reads another page data (e.g., lower page data) from a NAND memory to store in a transfer buffer as an error corrected page data. The error corrected page data stored in the transfer buffer is loaded to the one or more NAND page buffers.

23 Claims, 9 Drawing Sheets

(51) Int. Cl.
| | | |
|---|---|---|
| G11C 29/52 | (2006.01) | |
| G11C 16/04 | (2006.01) | |
| G06F 12/02 | (2006.01) | |
| G06F 3/06 | (2006.01) | |
| G11C 29/42 | (2006.01) | |
| G06F 12/08 | (2016.01) | |
| G11C 29/04 | (2006.01) | |

(52) U.S. Cl.
CPC .......... *G11C 11/5642* (2013.01); *G11C 29/52* (2013.01); *G06F 3/0619* (2013.01); *G06F 3/0656* (2013.01); *G06F 3/0679* (2013.01); *G06F 3/0688* (2013.01); *G06F 11/106* (2013.01); *G06F 11/1048* (2013.01); *G06F 12/0246* (2013.01); *G06F 12/0868* (2013.01); *G06F 2003/0691* (2013.01); *G06F 2212/202* (2013.01); *G06F 2212/2022* (2013.01); *G06F 2212/214* (2013.01); *G06F 2212/222* (2013.01); *G06F 2212/403* (2013.01); *G06F 2212/7201* (2013.01); *G06F 2212/7203* (2013.01); *G11C 16/0483* (2013.01); *G11C 29/42* (2013.01); *G11C 2029/0411* (2013.01); *G11C 2211/5641* (2013.01); *G11C 2211/5642* (2013.01); *G11C 2211/5643* (2013.01); *G11C 2211/5648* (2013.01)

(58) Field of Classification Search
USPC .................. 711/102, 105, 118; 714/764, 773
See application file for complete search history.

(56) References Cited

U.S. PATENT DOCUMENTS

| | | | | |
|---|---|---|---|---|
| 2010/0023800 A1* | 1/2010 | Harari | ................ | G06F 11/1068 714/2 |
| 2010/0318839 A1* | 12/2010 | Avila | ................ | G06F 12/0802 714/5.11 |
| 2012/0151118 A1* | 6/2012 | Flynn | ................ | G06F 11/1008 711/6 |
| 2012/0151166 A1* | 6/2012 | Suto | .................... | G06F 11/1068 711/162 |
| 2013/0185609 A1* | 7/2013 | Park | .................... | G06F 11/0751 714/746 |
| 2013/0304971 A1 | 11/2013 | Ishikawa | | |
| 2013/0304993 A1* | 11/2013 | DeBruyne | ........... | G06F 12/0875 711/125 |
| 2013/0318422 A1* | 11/2013 | Weathers | ................ | G06F 11/08 714/780 |
| 2014/0068365 A1* | 3/2014 | Chen | .................... | G06F 11/106 714/746 |
| 2014/0075099 A1* | 3/2014 | Ooneda | ................ | G06F 11/1048 711/103 |
| 2014/0101372 A1 | 4/2014 | Jung et al. | | |
| 2014/0164881 A1 | 6/2014 | Chen et al. | | |

OTHER PUBLICATIONS

PCI Express, "PCI Express Base Specification" Revision 3.0, Nov. 10, 2010, 349 pp. [Part A].
PCI Express, "PCI Express Base Specification" Revision 3.0, Nov. 10, 2010, 511 pp. [Part B].
PCT Notification of transmittal of the International Search Report & Written Opinion of the International Searching Authority, or the Declaration, dated Dec. 3, 2015, pp. 2, for Application No. PCT/US2015/047029, filed Aug. 26, 2015.
PCT International Search Report, dated Dec. 3, 2015, pp. 3, for Application No. PCT/US2015/047029, filed Aug. 26, 2015.
PCT Written Opinion of the International Searching Authority, dated Dec. 3, 2015, pp. 11, for Application No. PCT/US2015/047029, filed Aug. 26, 2015.
US2014101372 is the English language counterpart of CN103714856.

* cited by examiner

METHOD AND SYSTEM FOR USING NAND PAGE BUFFERS TO IMPROVE THE TRANSFER BUFFER UTILIZATION OF A SOLID STATE DRIVE

BACKGROUND

A solid state drive (SSD) is a data storage device that uses integrated circuit assemblies as memory to store data persistently. SSDs have no moving mechanical components and this distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency.

Many type of SSDs use NAND-based flash memory which retains data without power and is a type of non-volatile storage technology. An important goal of NAND flash development has been to reduce the cost per bit and increase maximum chip capacity so that flash memory may compete with magnetic storage devices like hard disks.

In a single-level cell (SLC) NAND, each cell may exist in one of two states, and store one bit of information per cell. A multi-level cell (MLC) NAND is a solid-state flash memory that uses multiple levels per cell to allow more bits to be stored using the same number of transistors. Some MLC NANDs have four possible states per cell, so they may store two bits of information per cell. TLC NAND (triple level cell NAND) is a type of multi-level solid-state NAND that stores three bits of information per cell of flash media. In certain situations, it may be desirable to manufacture higher storage capacity SSDs with TLC NANDs, in comparison to NAND flash memory that stores one or two bits of information per cell.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Misplacement errors are a major problem MLC NANDs. This issue is particularly worse for TLC NAND. In TLC NANDs three bits of data are programmed per cell. The first bits that are stored are referred to as the lower page data. The second bits that are stored are referred to as the upper page data, and third bits that are stored is referred to as the extra page data. As a result, TLC may have 8 states after programming the extra page data. The lower page data, the upper page data, and the extra page data may each be referred to as page data.

In TLC NAND, data may be written by first writing a lower page data by programming the lower page data into the TLC NAND, and then writing the upper page data by programming the upper page data into the TLC NAND. However, for writing the upper page data, the already written lower page data has to be read before the upper page data is programmed into the TLC NAND.

In TLC NANDs there may be read errors when the already written lower page data is read. Since TLC NANDs (or for that matter other NANDs) do not have internal mechanisms for error checking and correction (ECC), any errors in reading the lower page data may result in misplacement errors in programming the upper page data into the TLC NAND.

Since TLC NANDs do not have internal mechanisms for error checking and correction, certain embodiments provide mechanisms for using a transfer buffer of a controller of a solid state drive to perform an error checking and correction of lower page data already written to the TLC NAND and read from the TLC NAND, prior to writing the upper page data, to reduce misplacement errors. Since the transfer buffer is comprised of a type of volatile memory, such as static random access memory (SRAM), the storage space of the transfer buffer is relatively very small in comparison to the storage space of the TLC NANDs. The transfer buffer may be comprised of some other type of volatile memory that is different from a SRAM, as long as the volatile memory is very fast and as a result relatively expensive. Additionally, transfer buffers with large storage space are difficult to implement, as backup power mechanisms for preventing power failure that may lead to data loss in the transfer buffer are expensive to construct for transfer buffers with large storage space. Therefore, the size of the transfer buffer should be relatively small, and additional embodiments provide mechanisms for reducing the size of the transfer buffer of the controller of the solid state drive, by using one or more NAND page buffers to store the upper page data while the lower page data is stored in the transfer buffer.

Figure 1:
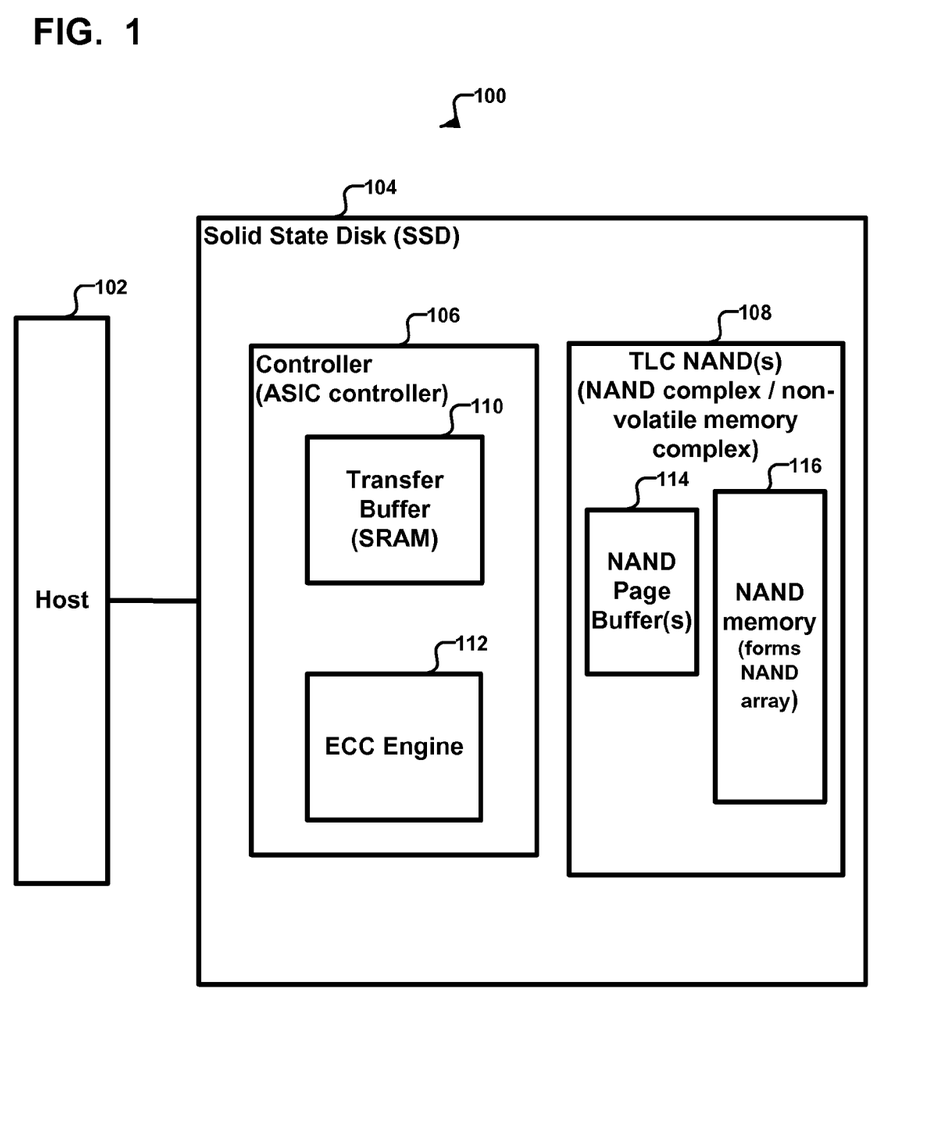
FIG. 1 illustrates a block diagram of a computing environment in which a host writes data to a SSD, in accordance with certain embodiments.

FIG. 1 illustrates a block diagram of a computing environment 100 in which a host 102 writes data to a SSD 104, in accordance with certain embodiments. The SSD 102 may be comprised of a controller 106 and a NAND complex 108, where in certain embodiments the NAND complex 108 may be a TLC NAND. In other embodiments the SSD 104 may be comprised of a controller that controls certain other types of non-volatile memory, such as NOR memory or some other suitable non-volatile memory. It may be noted that certain embodiments may be implemented in a SSD that is made of non-volatile memory that includes NAND memory, NOR memory or any other suitable non-volatile memory. In certain embodiments, the SSD 104 may be capable of storing several terabytes of data or more, and a plurality of TLC NANDs 108, each storing several gigabytes of data or more, may be found in the SSD 104.

In certain embodiments, the controller 106 may be implemented via an application-specific integrated circuit (ASIC). The controller 106 may have a transfer buffer 110 and an ECC engine 112. The transfer buffer 110 may be a SRAM, and the ECC engine 112 may be implemented in circuitry or firmware. While the TLC NAND may be of the order of gigabytes in storage space, the transfer buffer 110 may be of the order of kilobytes or megabytes in storage space.

The TLC NAND 108 may be comprised of a plurality of NAND page buffers 114 and NAND memory 116. The NAND page buffers 114 may be around four in number (or more) and may be of the order of kilobytes in storage space. For example, in certain embodiments each NAND page buffer has a storage space of 64 kilobytes.

In certain embodiments, the host 102 may be comprised of any suitable computational device, such as a personal computer, a mainframe, a telephony device, a smart phone, a storage controller, a blade computer, a processor with memory, etc. In certain embodiments, the host 102 may communicate with the SSD 104 over a bus (such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN), etc.

In certain embodiments, the host 102 sends lower and upper pages of data to the SSD 104 for writing to the TLC NANDs 108 of the SSD 104. The pages (lower and/or upper) are stored by the controller 106 of the SSD 104 in the transfer buffer 110, and the controller 106 communicates to the host 102 that the pages have been written to the SSD. Thus, the writing of data by the host 102 to the SSD 104 is asynchronous. The pages are written to the transfer buffer 110 in a few microseconds as the transfer buffer is implemented via SRAM. However, writing to the NAND memory 116 takes time in the order of milliseconds and is performed from the transfer buffer 110 by the controller 106 at a later time after informing the host 102 that the data has been written to the SSD 104. The performance of the SSD 104 is improved by first storing pages in the fast transfer buffer 106 and then transferring the pages to the relatively slower NAND memory 116.

Figure 2:
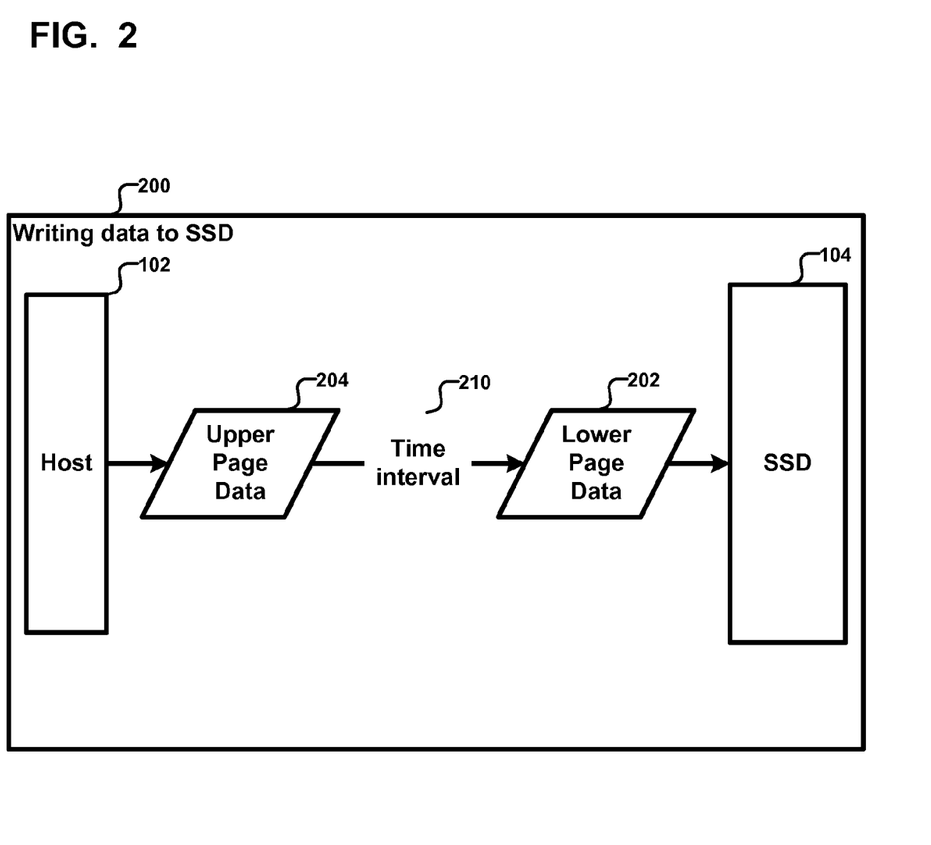
FIG. 2 illustrates another block diagram that shows how lower page data and then upper page data are written to the SSD, in accordance with certain embodiments.

FIG. 2 illustrates another block diagram 200 that shows how lower page data 202 and then upper page data 204 are written to the SSD 104 from the host 102, in accordance with certain embodiments. First the host 102 sends the lower page data 202 to the SSD 104, and then after a time interval 210 sends the upper page data 204. In certain embodiments, each of the lower and upper page data may be 64 kilobytes and about 100 to 1000 bytes of additional space may be needed for error correction information.

Therefore, FIG. 2 illustrates certain embodiments in which to write data to the SSD 104, the host 102 first sends the lower page data 202 and then sends the upper page data 204 after a time interval 210.

Figure 3:
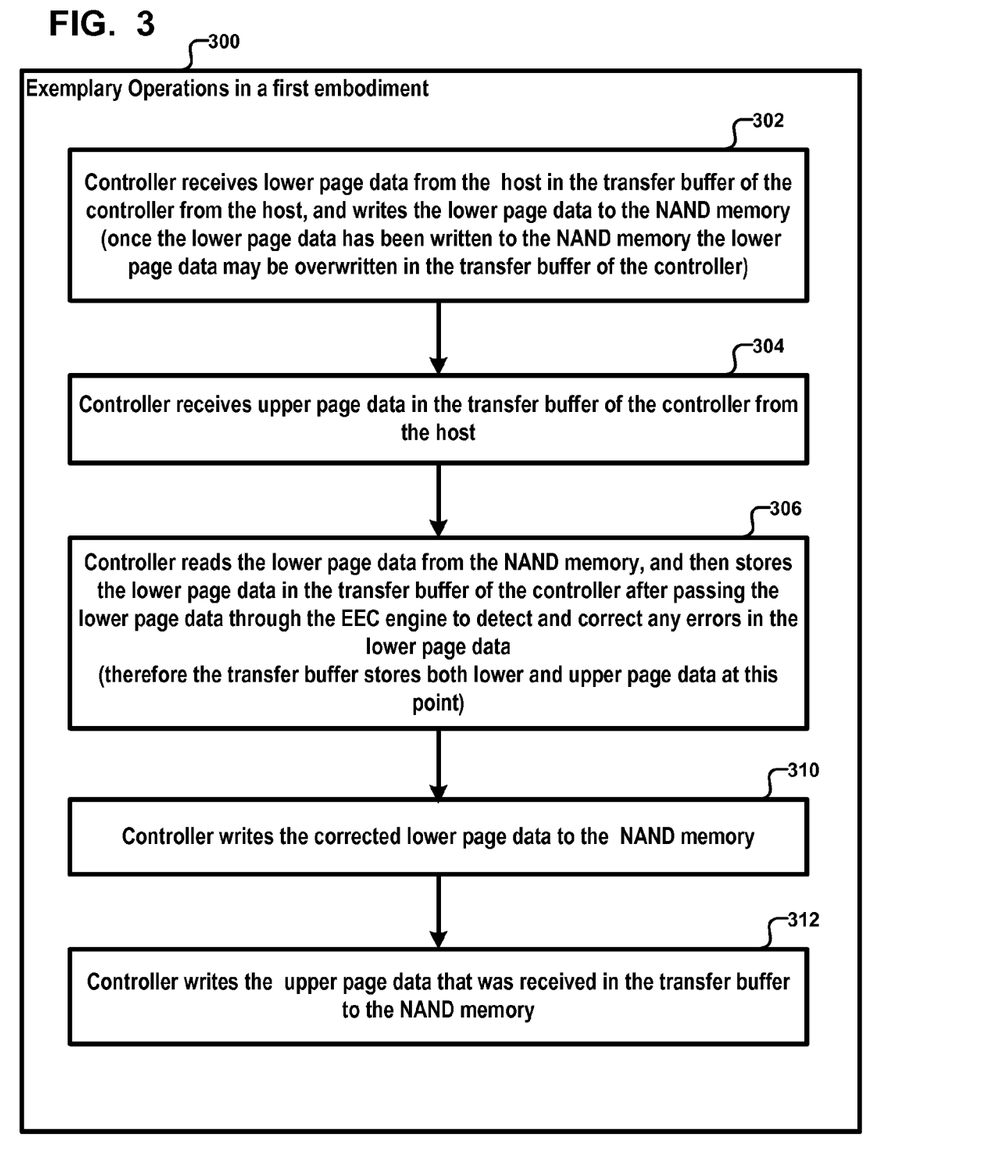
FIG. 3 illustrates a flowchart that shows first exemplary operations for writing data to a SSD, in accordance with certain embodiments.

FIG. 3 illustrates a flowchart 300 that shows first exemplary operations for writing data to a SSD 104, in accordance with certain embodiments. The operations shown in FIG. 3 may be performed by the controller 106 that is implemented in the SSD 104.

Control starts at block 302 in which the controller 106 receives the lower page data 202 from the host 102 in the transfer buffer 110 of the controller 106 from the host 102, and writes the lower page data 202 to the NAND memory 116, by programming the NAND memory 116. Once the lower page data 202 has been written to the NAND memory 116, the lower page data may be overwritten in the transfer buffer 110 of the controller 110 as the amount of available space in the transfer buffer 110 is relatively small and the available space is needed to store additional pages being sent by the host 102.

After a period of time, the controller 106 receives (at block 304) the upper page data 204 in the transfer buffer 110 of the controller 106 from the host 102. The upper page data 204 cannot be programmed into the NAND memory 116 unless the controller 106 reads the lower page data from the NAND memory 116. Therefore, the controller 106 reads (at block 306) the lower page data 202 from the NAND memory 116 and stores the lower page data 202 in the transfer buffer 110 of the controller 106 after passing the lower page data 202 through the ECC engine 112 to detect and correct any errors in the lower page data 202 in the ECC engine 112. The ECC engine 112 is responsible for transferring the corrected lower page data 202 to the transfer buffer 110. At this point in time, the transfer buffer 110 stores both the lower page data 202 as well as the upper page data 204.

It should be noted that the lower page data is correct if the lower page data has no read errors. If the lower page data is not correct then the lower page data is corrected in the ECC engine 112. It should be noted that during this process the lower page data first passes through ECC engine 112 where the lower page data gets corrected if there are any errors. After that the corrected data is transferred to the transfer buffer 110 from the ECC engine 112.

Control proceeds to block 310 in which the controller 106 writes the corrected lower page data to the NAND memory 116. The controller 106 then writes (at block 312) the upper page data that was received in the transfer buffer 110 to the NAND memory 116, by programming the NAND memory 116.

Therefore, FIG. 3 illustrates certain embodiments in which a transfer buffer 110 is used to store lower page data read from the NAND memory 116 for correction of read errors, in order to program the upper page data into the NAND memory 116.

Figure 4:
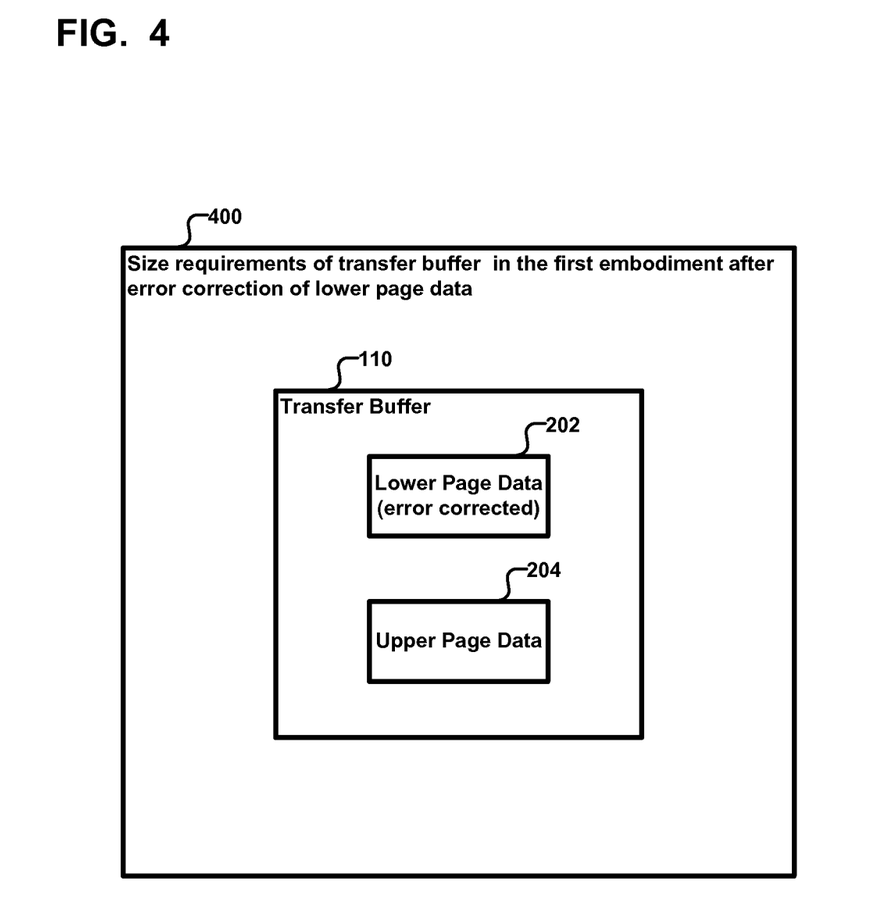
FIG. 4 illustrates a block diagram that shows the size requirements of a transfer buffer to implement the first exemplary operations shown in FIG. 3, in accordance with certain embodiments.

FIG. 4 illustrates a block diagram 400 that shows the size requirements of a transfer buffer 110 to implement the first exemplary operations 300 shown in FIG. 3, in accordance with certain embodiments.

In FIG. 4, it can be seen that immediately after the execution of the operations shown in block 306 of FIG. 3 (i.e., after the controller 106 reads the lower page data 202 from the NAND memory 116 into the transfer buffer 110 via ECC error correction of the lower page data 202), both the lower page data 202 and the upper page data 204 are stored at the same time in the transfer buffer 110. So while error correction is performed to reduce the incidence of misplacement errors, there is a greater requirement of storage space in the transfer buffer 110 as both the lower page data 202 and the upper page data 204 have to be simultaneously stored in the transfer buffer 110.

Figure 5:
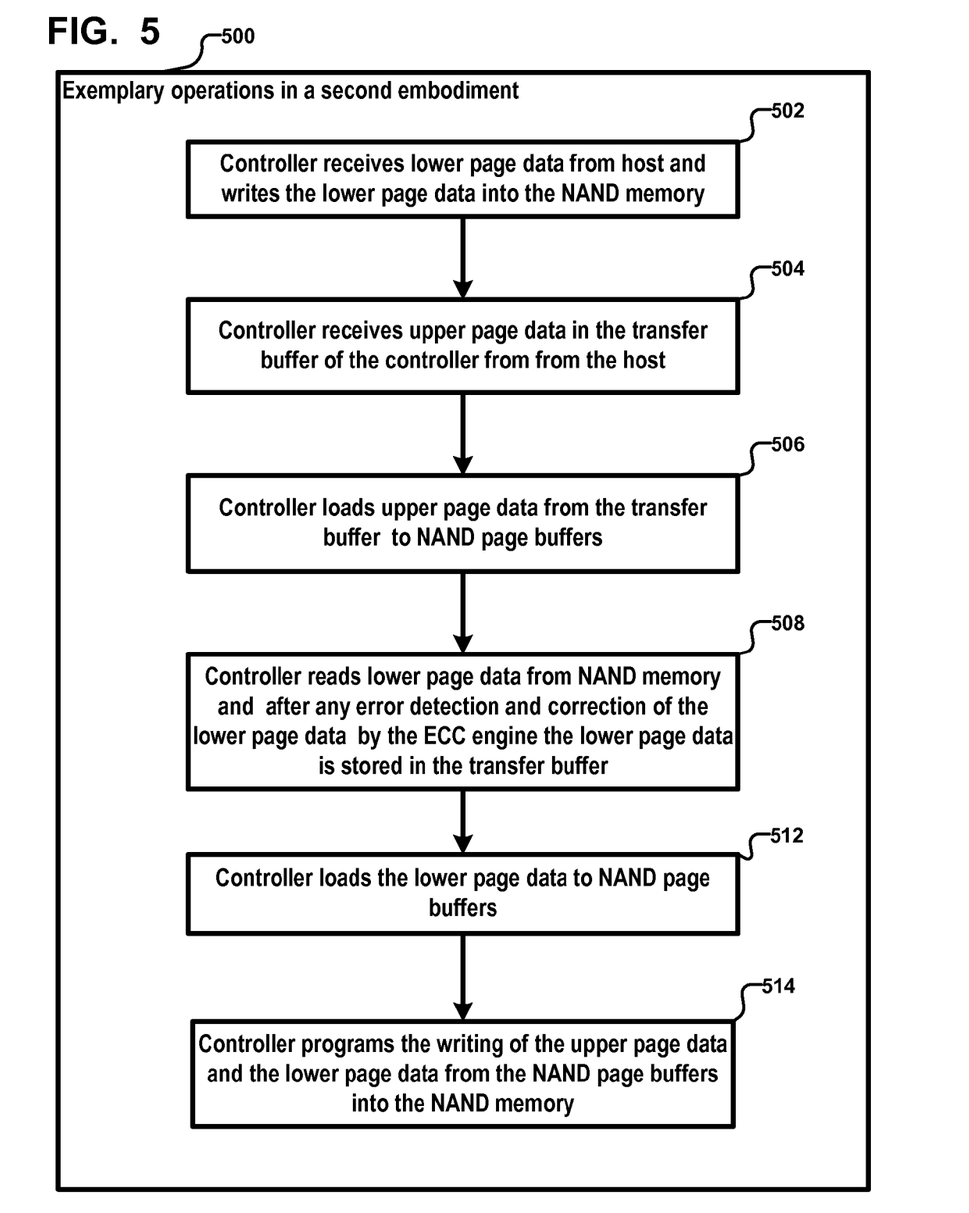
FIG. 5 illustrates a flowchart that shows second exemplary operations for writing data to a SSD, in accordance with certain embodiments.

FIG. 5 illustrates a flowchart 500 that shows second exemplary operations for writing data to a SSD 104, in accordance with certain embodiments. The operations shown in FIG. 5 may be performed by the controller 106 that is implemented in the SSD 104. The operations shown in FIG. 5 reduce the amount of storage space needed in the transfer buffer 110, even when misplacement errors are reduced via error correction of the lower page data 202 in the controller 106.

Control starts at block 502 in which the controller 106 receives the lower page data 202 from the host 102 and writes the lower page data 202 into the NAND memory 116 by programming the NAND memory 116. After writing the lower page data 202 to the NAND memory, the lower page data 202 may be overwritten by other pages in the transfer buffer 110.

Control proceeds to block 504 in which the controller 106 receives the upper page data 204 in the transfer buffer 110 of the controller 106 from the host 102. The controller 110 loads (at block 506) the upper page data 204 from the transfer buffer 204 to one or more NAND page buffers 114. It may be noted that the loading of the upper page data 204 to the NAND page buffers 114 is very fast (e.g., of the order of 10 microseconds), since the NAND page buffers 114 are SRAM and not flash memory cells. The number of NAND page buffers needed for loading the upper page data 204 depends on the size of the upper page data 204 and the size of each NAND page buffer. In certain embodiments, the size each NAND page buffer is designed to hold single page data as all program/read data goes through the NAND page buffers. It should be noted that for the embodiments presented in this disclosure, no change is needed in the size of the NAND page buffers of existing TLC NANDs.

The controller 106 reads (at block 508) the lower page data 202 from NAND memory 116 and after error detection and correction of the lower page data 202 via the ECC engine 112 stores the lower page data in the transfer buffer 110. It should be noted that read operations may be performed from the NAND memory 116 when data (e.g., the upper page data 204) is loaded into one of the NAND page buffers 114. Since the upper page data 204 is already in the one or more NAND page buffers 114 at this time, the upper page data 204 in the transfer buffer 110 may be overwritten by the lower page data 202 or other pages that arrive for storage in the transfer buffer 110.

Since the lower page data 202 that is read from the NAND memory 116 may have errors, the ECC engine 112 of the controller 106 determines if the lower page data 202 is correct (i.e., has no read errors), and if not corrects the lower page data 202 and sends the lower page data 202 to the transfer buffer 110 (i.e., the lower page data is corrected in the ECC engine 112 and then the corrected lower page data is transferred to the transfer buffer 110).

Control proceeds to block 512 in which the controller 106 loads the lower page data 202 from the transfer buffer 110 into the one or more NAND page buffers 114. After the execution of the operations of block 512, both the upper page data 204 and the lower page data 202 are in the one or more NAND page buffers 114. The controller 106 programs (at block 514) the writing of the upper page data 204 and the lower page data 202 from the NAND page buffers 114 into the NAND memory 116.

Therefore FIG. 5 illustrates certain embodiments in which storage space requirements of the transfer buffer 110 are reduced in comparison to embodiments shown in FIG. 3. While in the embodiments shown in FIG. 3 the transfer buffer 110 needed to store both the lower page data 202 and the upper page data 204 at the same time, in the embodiments shown in FIG. 5 both the lower page data 202 and the upper page data 204 do not have to be stored in the transfer buffer 110 at the same time.

Figure 6:
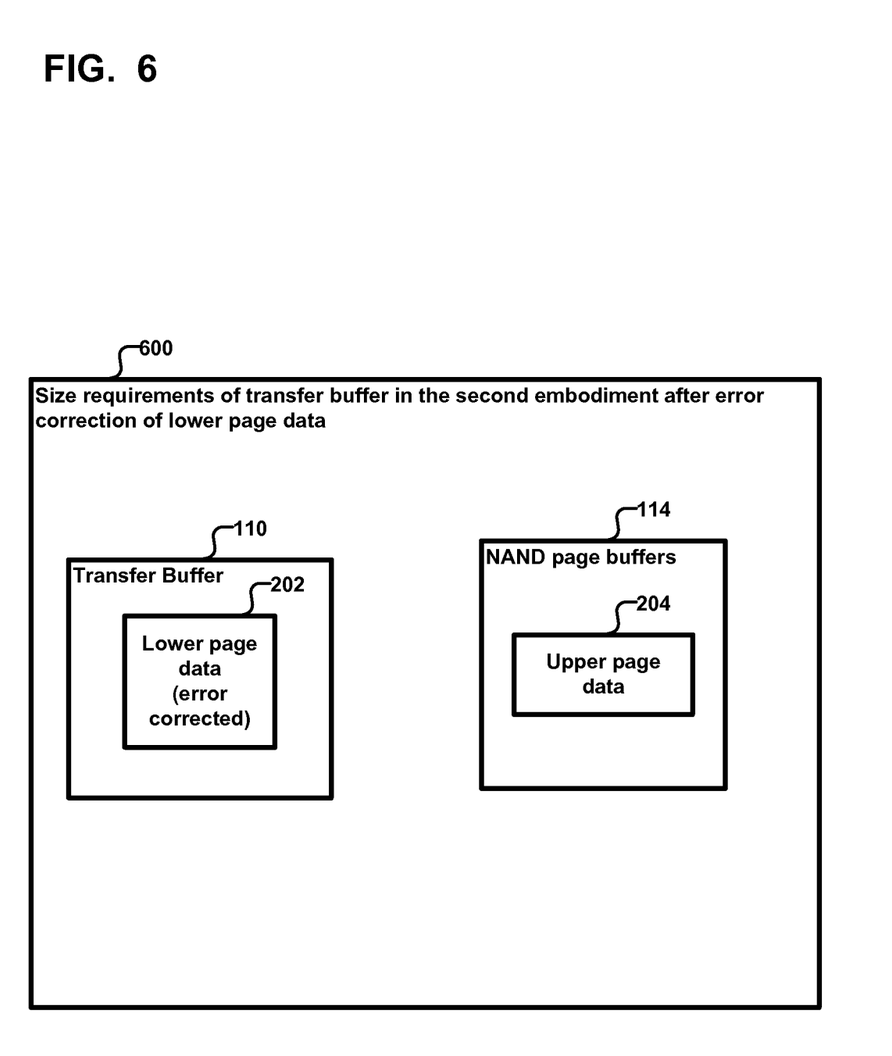
FIG. 6 illustrates a block diagram that shows the size requirements of a transfer buffer to implement the second exemplary operations shown in FIG. 5, in accordance with certain embodiments.

FIG. 6 illustrates a block diagram 600 that shows the size requirements of the transfer buffer 110 to implement the second exemplary operations shown in FIG. 5, in accordance with certain embodiments. In FIG. 6, the location of the lower page data 202 and the upper page data 204 are shown at the end of the execution of the operations shown in block 508, just after the error correction of the lower page data 202 and the storing of the lower page data 202 in the transfer buffer 110. It may be seen that the transfer buffer 110 stores the lower page data 202, whereas the upper page data 204 is stored in the one or more NAND page buffers 114. Therefore, by using the NAND page buffers 114 to store the upper page data 204, the space requirements of the transfer buffer 110 is reduced, in comparison to embodiments shown in FIG. 4 where both the lower page data 202 and the upper page data 204 were stored in the transfer buffer 110.

Figure 7:
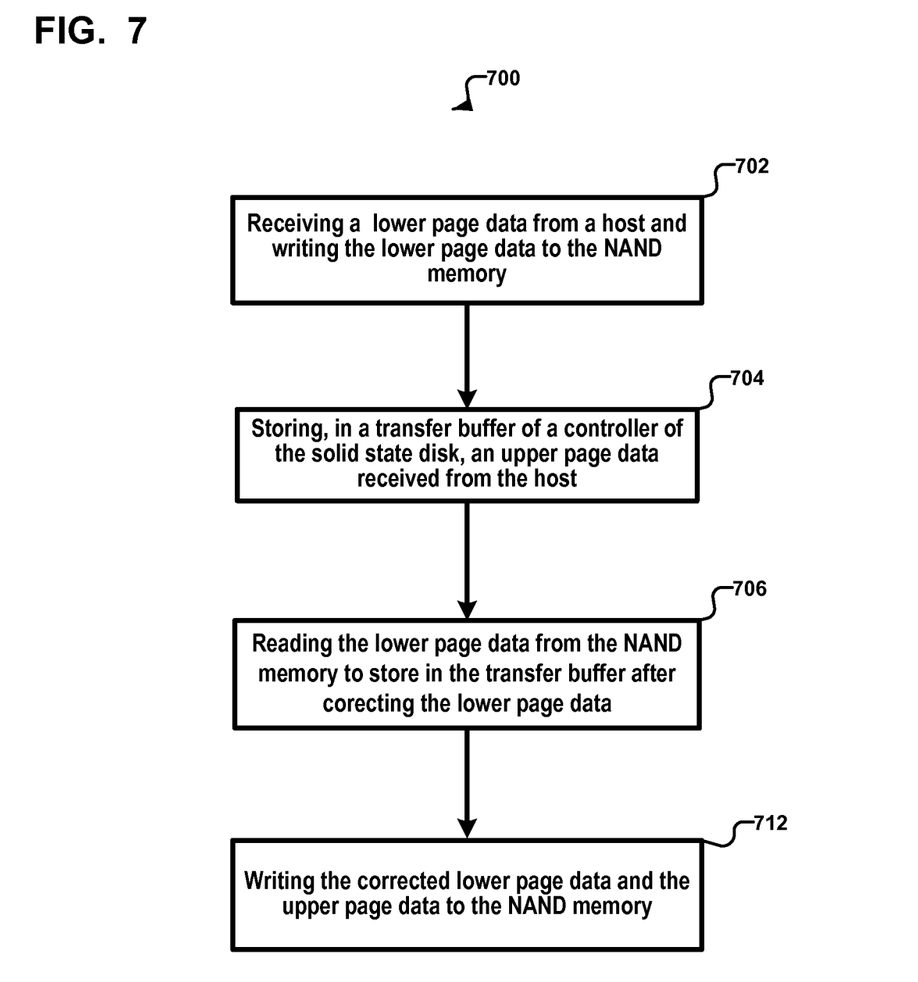
FIG. 7 illustrates a flowchart that shows third exemplary operations for writing data to a SSD, in accordance with certain embodiments.

FIG. 7 illustrates a flowchart 700 that shows third exemplary operations for writing data to a SSD 104, in accordance with certain embodiments. The operations shown in FIG. 7 may be performed by the controller 106 that is implemented in the SSD 104.

Control starts at block 702, in which a controller 106 receives a lower page data 202 from a host 102 and writes the lower page data to the NAND memory 116 (or another suitable non-volatile memory, such as a NOR memory). Control proceeds to block 704 in which an upper page data 204 received from the host 102 is stored in the transfer buffer 106 of the controller 106 of the solid state drive 104. The lower page data 202 is read (at block 706) from the NAND memory 116 to store in the transfer buffer 110 after correction via an ECC engine 112. The corrected lower page data and the upper page data are written (at block 712) to the NAND memory 116.

Therefore, FIG. 7 illustrates certain embodiments that use the transfer buffer 110 of the controller 106 to reduce misplacement errors in the NAND memory 116 of the SSD 104.

Figure 8:
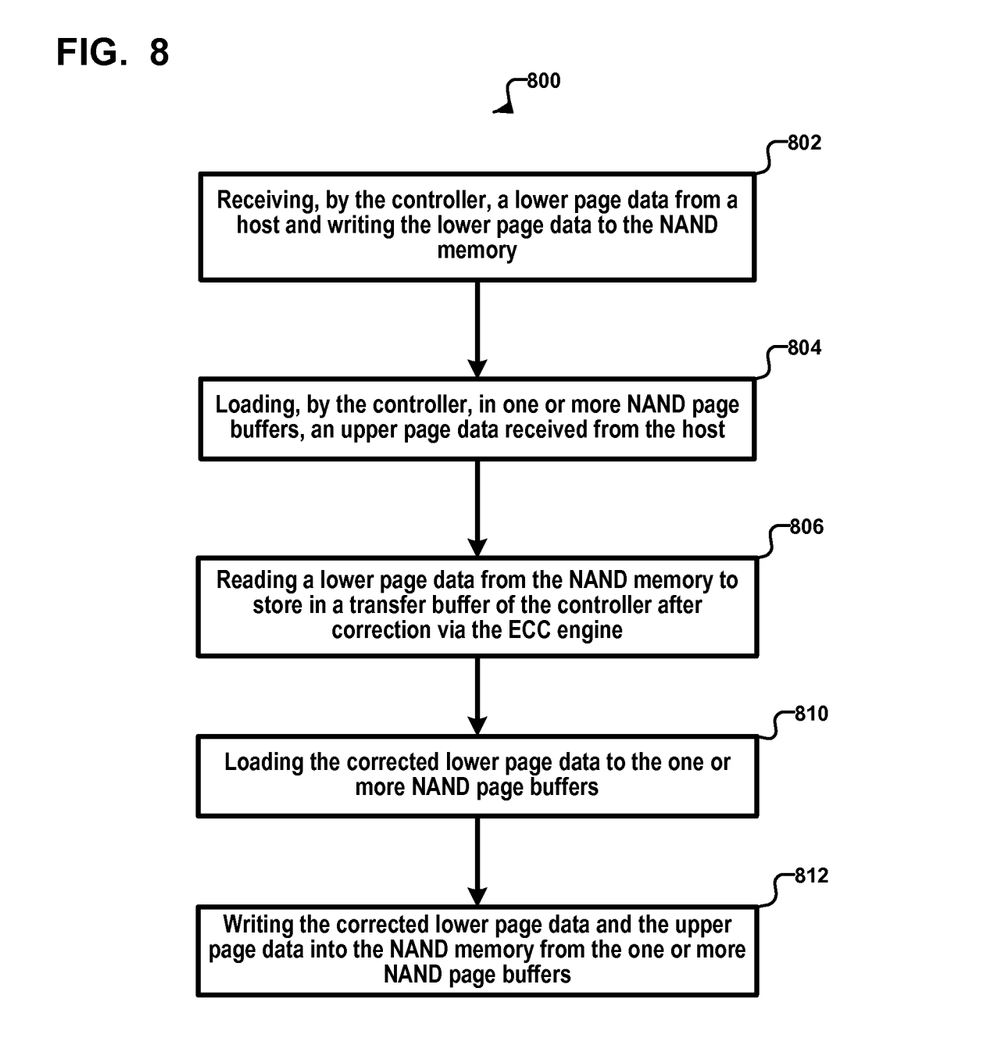
FIG. 8 illustrates a flowchart that shows fourth exemplary operations for writing data to a SSD, in accordance with certain embodiments.

FIG. 8 illustrates a flowchart 800 that shows fourth exemplary operations for writing data to a SSD, in accordance with certain embodiments. The operations shown in FIG. 8 may be performed by the controller 106 that is implemented in the SSD 104.

Control starts at block 802, in which a controller 106 receives a lower page data 202 from a host 102 and writes the lower page data 202 to the NAND memory 116 (or some other suitable non-volatile memory, such as a NOR memory). Control proceeds to block 804 in which the controller 106 loads an upper page data 204 received from the host 102 in one or more NAND page buffers 114. The controller reads (at block 806) the lower page data 202 from the NAND memory 116 to store in the transfer buffer 110 after correction via the ECC engine 112. The corrected lower page data 202 stored in the transfer buffer 110 is loaded (at block 810) to the one or more NAND page buffers 114. Control proceeds to block 812, in which the corrected lower page data and the upper page data are written to the NAND memory 116 from the one or more NAND page buffers 114.

Therefore, FIG. 8 illustrates certain embodiments that use the transfer buffer 110 of the controller 106 to reduce misplacement errors in the NAND memory 116 of the SSD 104, while at the same time reducing the storage requirements of the transfer buffer 110 by storing the upper page data 204 in NAND page buffers 114 when the lower page data 202 is read into the transfer buffer 110 for error correction.

Therefore, FIGS. 1-8 illustrate certain embodiments for reducing misplacement errors in a solid state drive by performing error correction of lower page data read from a NAND memory, prior to writing the upper page data received from the host into the NAND memory. In certain embodiments, storage space in the transfer buffer is conserved by moving the upper page data from the transfer buffer to one or more NAND page buffers when error correction is being performed on the lower page data in the controller of the solid state drive.

In certain MLC NANDs, two bits of information are stored in the same physical cell. The first set of bits that are stored are referred to as the lower page data and second set of bits that are stored are referred to as the upper page data. For example, in certain embodiments the lower page data of 4 kilobytes (i.e., 32 kilobits) is stored in 32K physical cells, and subsequently the upper page data is stored in the same 32K physical cells TLC programming is a super set of certain types of MLC programming and in TLC programming 3 bits of data are programmed per cell. The first bits that are stored are referred to as the lower page data. The second bits that are stored is referred to as the upper page data, and third bits that are stored are referred to as the extra page data. As a result, TLC may have 8 states after programming the extra page data.

The embodiments described in FIGS. 1-8 may be implemented in certain MLC NANDs as well as in TLC NANDs. While FIGS. 1-8 describe lower page correction while programming the upper page, in TLC NANDs either upper or lower pages may be corrected during the programming of the extra page.

Therefore, in certain embodiments, a page data (e.g. an upper page data) received from a host is stored in a transfer buffer of a controller of the solid state drive. Another page data (e.g., a lower page data) is read from a NAND memory to store in the transfer buffer as an error corrected page data. The error corrected page data (e.g., the error corrected lower page data) and the page data (e.g., the upper page data) are written to the NAND memory.

In additional embodiments, a controller loads a page data (e.g. an upper page data) received from the host in one or more NAND page buffers. The controller reads another page data (e.g., lower page data) from a NAND memory to store in a transfer buffer as an error corrected page data. The error corrected page data stored in the transfer buffer is loaded to the one or more NAND page buffers.

In certain embodiments, a page data (e.g. extra page data) received from a host is stored in a transfer buffer of a controller of the solid state drive. Another page data (e.g., lower or upper page data) is read from a NAND memory to store in the transfer buffer as an error corrected page data. The error corrected page data and the page data are written to the NAND memory.

In additional embodiments, a controller loads a page data (e.g., extra page data) received from the host in one or more NAND page buffers. The controller reads another page data (e.g., lower or upper page data) from a NAND memory to store in a transfer buffer as an error corrected page data. The error corrected page data stored in the transfer buffer is loaded to the one or more NAND page buffers.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 9:
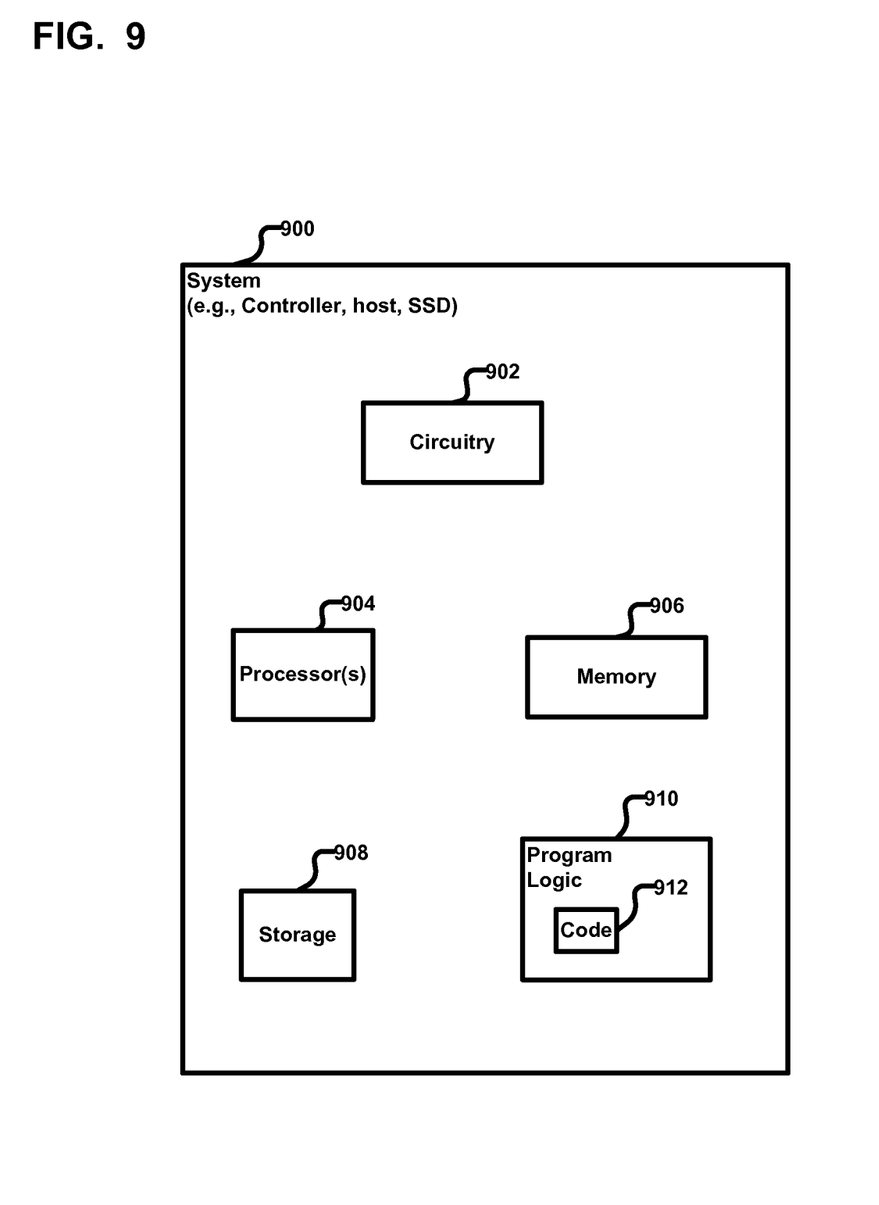
FIG. 9 illustrates a block diagram of a computational device, in accordance with certain embodiments.

FIG. 9 illustrates a block diagram of a system 900 that corresponds to the controller 106, the host 102, or the SSD 104, in accordance with certain embodiments. The system 900 may include a circuitry 902 that may in certain embodiments include at least a processor 904. The system 900 may also include a memory 906 (e.g., a volatile memory device), and storage 908. The storage 908 may include a non-volatile memory device (e.g., EEPROM, ROM, PROM, RAM, flash, firmware, programmable logic, etc.), magnetic disk drive, optical disk drive, tape drive, etc. The storage 908 may comprise an internal storage device, an attached storage device and/or a network accessible storage device. The system 900 may include a program logic 910 including code 912 that may be loaded into the memory 906 and executed by the processor 904 or circuitry 902. In certain embodiments, the program logic 910 including code 912 may be stored in the storage 908. In certain other embodiments, the program logic 910 may be implemented in the circuitry 902. Therefore, while FIG. 9 shows the program logic 910 separately from the other elements, the program logic 910 may be implemented in the memory 906 and/or the circuitry 902.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

Examples

The following examples pertain to further embodiments.

Example 1 is a method, in which a page data received from a host is stored in a transfer buffer of a controller of a solid state drive. Another page data is read from a non-volatile memory to store in the transfer buffer as an error corrected page data. The error corrected page data and the page data are written to the non-volatile memory.

In example 2, the subject matter of example 1 may include that the non-volatile memory is a NAND memory, wherein the page data is an upper page data, wherein the another page data is a lower page data, and wherein the transfer buffer has adequate storage capacity to accommodate both the lower page data and the upper page data at the same time.

In example 3, the subject matter of claim 2 may include that the controller receives the upper page data from the host subsequent to receiving the lower page data from the host. The received lower page data is written to the NAND memory prior to receiving the upper page data from the host, and the reading of the lower page data written to the NAND memory is needed to write the upper page data to the NAND memory.

In example 4, the subject matter of claim 2 may include that the host writes the data to the solid state drive by first transmitting the lower page data and then transmitting the upper page data to the controller of the solid state drive, wherein the solid state drive is comprised of: the controller comprising the transfer buffer and an error checking and correction (ECC) engine for at least correcting the lower page data; and a triple level cell (TLC) NAND comprising the NAND memory.

In example 5, the subject matter of claim 2 may include that the error correcting of the lower page data in the controller is performed via an error checking and correction (ECC) engine executing in the controller to reduce misplacement errors in the solid state drive, wherein misplacement errors caused by read errors of the lower page data are reduced by the reading and the error correcting of the lower page data by the controller, and subsequently the writing of the error corrected lower page data followed by the upper page data to the NAND memory.

In example 6, the subject matter of claim 1 may include that the page data is an extra page data, wherein the another page data is a lower page data or an upper page data.

Example 7 is another method, in which a controller loads a page data received from a host in one or more NAND page buffers of a solid state drive. The controller reads another page data from a NAND memory to store in a transfer buffer as an error corrected page data. The error corrected page data stored in the transfer buffer is loaded to the one or more NAND page buffers.

In example 8, the subject matter of claim 7 may include that the page data is an upper page data, wherein the another page data is a lower page data. The error corrected lower page data and the upper page data are written into the NAND memory from the one or more NAND page buffers.

In example 9, the subject matter of claim 8 may include that that storage capacity requirements of the transfer buffer is reduced because the transfer buffer does not have to accommodate both the lower page data and the upper page data at the same time. The controller receives the upper page data from the host subsequent to receiving the lower page data from the host, and the received lower page data is written to the NAND memory prior to receiving the upper page data from the host. The reading of the lower page data written to the NAND memory is needed to write the upper page data to the NAND memory.

In example 10, the subject matter of claim 8 may include that the host writes the data to the solid state drive by first transmitting the lower page data and then transmitting the upper page data to the controller of the solid state drive. The solid state drive is comprised of the controller comprising the transfer buffer and an error checking and correction (ECC) engine for at least correcting the lower page data, and a triple level cell (TLC) NAND comprising the NAND memory and the one or more NAND page buffers.

In example 11, the subject matter of claim 8 may include that the error correcting of the lower page data in the controller is performed via an error checking and correction (ECC) engine executing in the controller, wherein misplacement errors caused by read errors of the lower page data are reduced by the reading and the error correcting of the lower page data by the controller, and subsequently writing the error corrected lower page data and the upper page data to the NAND memory.

In example 12, the subject matter of claim 7 may include that the page data is an extra page data, and wherein the another page data is a lower page data or an upper page data.

Example 13 is an apparatus comprising: a non-volatile memory, and a controller comprising a transfer buffer and an error checking and correction (ECC) engine, wherein the controller controls the non-volatile memory. The controller is operable to store, in the transfer buffer, a page data received from a host, read another page data from the non-volatile memory to store in the transfer buffer as an error corrected page data, and write the error corrected page data and the page data to the non-volatile memory.

In example 14, the subject matter of claim 13 may include that the non-volatile memory is a NAND memory, wherein the page data is an upper page data, wherein the another page data is a lower page data, and wherein the transfer buffer has adequate storage capacity to accommodate both the lower page data and the upper page data at the same time.

In example 15, the subject matter of claim 14 may include that the controller receives the upper page data from the host subsequent to receiving the lower page data from the host. The received lower page data is written to the NAND memory prior to receiving the upper page data from the host. The reading of the lower page data written to the NAND memory is needed to write the upper page data to the NAND memory.

In example 16, the subject matter of claim 14 may include that the host writes the data to the apparatus by first transmitting the lower page data and then transmitting the upper page data to the controller of the apparatus, wherein the NAND memory corresponds to a triple level cell (TLC) NAND.

In example 17, the subject matter of example 14 may include that the error correcting of the lower page data in the controller is performed via an error checking and correction (ECC) engine executing in the controller to reduce misplacement errors in the apparatus, and wherein misplacement errors caused by read errors of the lower page data are reduced by reading and error correcting the lower page data by the controller, and subsequently writing the error corrected lower page data followed by upper page data to the NAND memory.

In example 18, the subject matter of example 13 may include that the page data is an extra page data, and wherein the another page data is a lower page data or an upper page data.

Example 19 is an apparatus, comprising a NAND complex comprising one or more NAND page buffers and a NAND memory, a controller comprising a transfer buffer and an error checking and correction (ECC) engine, wherein the controller controls the NAND complex. The controller is operable to load, in one or more NAND page buffers, a page data received from a host, read another page data from the NAND memory to store in a transfer buffer as an error corrected page data, and load the error corrected page data to the one or more NAND page buffers.

In example 20, the subject matter of example 19 may include that the page data is an upper page data, and wherein the another page data is a lower page data, and wherein the controller is further operable to write the error corrected lower page data and the upper page data into the NAND memory from the one or more NAND page buffers.

In example 21, the subject matter of claim 20 may include that the storage capacity requirements of the transfer buffer is reduced because the transfer buffer does not have to accommodate both the lower page data and the upper page data at the same time. The controller receives the upper page data from the host subsequent to receiving the lower page data from the host, and the received lower page data is written to the NAND memory prior to receiving the upper page data from the host. Reading of the lower page data written to the NAND memory is needed to write the upper page data to the NAND memory.

In example 22, the subject matter of claim 20 may include that the host writes the data to the apparatus by first transmitting the lower page data and then transmitting the upper page data to the controller of the apparatus, and wherein the NAND complex is a triple level cell (TLC) NAND.

In example 23, the subject matter of claim 20 may include that the error correcting of the lower page data in the controller is performed via an error checking and correction (ECC) engine executing in the controller, wherein misplacement errors caused by read errors of the lower page data are reduced by the reading and the error correcting of the lower page data by the controller, and subsequently writing the error corrected lower page data and the upper page data to the NAND memory.

In example 24, the subject matter of claim 19 may include that page data is an extra page data, wherein the another page data is a lower page data or an upper page data.

In example 25, the subject matter of claim 19 may include that the apparatus further comprises a NAND device, comprising: a plurality of NAND page buffers, and a NAND array comprised of a plurality of NAND memory elements including the NAND memory, wherein the NAND device is configured to store incoming page data to a NAND page buffer of the plurality of NAND page buffers, and then allow read operations to the NAND array, and then allow further transfer of read data to the controller, without corrupting the incoming page data stored in the NAND page buffer.

What is claimed is:

1. A method, comprising:
    writing a lower page data from a transfer buffer of a controller of a solid state drive to a nonvolatile memory in a solid state drive;
    subsequent, to writing the lower page data to the nonvolatile memory, storing in the transfer buffer an upper page data received from a host;
    subsequent to storing the upper page data in the transfer buffer, reading the lower page data from the nonvolatile memory to store in the transfer buffer as an error corrected lower page data, wherein the error corrected lower page data is stored in the transfer buffer in addition to the upper page data that is already stored in the transfer buffer;
    writing the error corrected lower page data to the nonvolatile memory from the transfer buffer that stores both the error corrected lower page data and the upper page data; and
    subsequent to writing the error corrected lower page data to the non-volatile memory from the transfer buffer that stores both the error corrected lower page data and the upper page data, writing the upper page data stored in the transfer buffer to the non-volatile memory.

2. The method of claim 1, wherein the non-volatile memory is a NAND memory, wherein the transfer buffer has adequate storage capacity to accommodate both the lower page data and the upper page data at the same time.

3. The method of claim 2, wherein:
the controller receives the upper page data from the host subsequent to receiving the lower page data from the host;
the received lower page data is written to the NAND memory prior to receiving the upper page data from the host; and
reading of the lower page data written to the NAND memory is needed to write the upper page data to the NAND memory.

4. The method of claim 2, wherein the host writes data comprising the lower page data and the upper page data to the solid state drive by first transmitting the lower page data and then transmitting the upper page data to the controller of the solid state drive, and wherein the solid state drive is comprised of:
the controller comprising the transfer buffer and an error checking and correction (ECC) engine for at least correcting the lower page data; and
a triple level cell (TLC) NAND comprising the NAND memory.

5. The method of claim 2, wherein error correcting of the lower page data in the controller is performed via an error checking and correction (ECC) engine executing in the controller to reduce misplacement errors in the solid state drive, and wherein misplacement errors caused by read errors of the lower page data are reduced by the reading and the error correcting of the lower page data by the controller, and subsequently writing the error corrected lower page data followed by upper page data to the NAND memory.

6. A method, comprising:
receiving, by a controller, lower page data from a host and writing the lower page data into a NAND memory of a solid state drive;
subsequent to writing the lower page data into the NAND memory, loading from a transfer buffer of the controller, by the controller, in one or more NAND page buffers of the solid state drive, an upper page data received from the host;
subsequent to loading the upper page data in the one or more NAND page buffers, reading the lower page data from the NAND memory to store in the transfer buffer of the controller as an error corrected lower page data, wherein the transfer buffer on storing the error corrected lower page data no longer has the upper page data; and
subsequent to storing error corrected lower page data in the transfer buffer, loading the error corrected lower page data to the one or more NAND page buffers; and
subsequent to loading the error corrected lower page data to the one or more NAND page buffers, programming the writing of the upper page data and the error corrected lower page data from the one or more NAND page buffers into the NAND memory.

7. The method of claim 6, wherein storage capacity requirements of the transfer buffer is reduced because the transfer buffer does not have to accommodate both the lower page data and the upper page data at the same time, and wherein:
the controller receives the upper page data from the host subsequent to receiving the lower page data from the host;
the received lower page data is written to the NAND memory prior to receiving the upper page data from the host; and
reading of the lower page data written to the NAND memory is needed to write the upper page data to the NAND memory.

8. The method of claim 6, wherein the host writes data comprising the upper page data and the lower page data to the solid state drive by first transmitting the lower page data and then transmitting the upper page data to the controller of the solid state drive, and wherein the solid state drive is comprised of:
the controller comprising the transfer buffer and an error checking and correction (ECC) engine for at least correcting the lower page data; and
a triple level cell (TLC) NAND comprising the NAND memory and the one or more NAND page buffers.

9. The method of claim 6, wherein error correcting of the lower page data in the controller is performed via an error checking and correction (ECC) engine executing in the controller, and wherein misplacement errors caused by read errors of the lower page data are reduced by the reading and the error correcting of the lower page data by the controller, and subsequently writing the error corrected lower page data and the upper page data to the NAND memory.

10. An apparatus, comprising:
a non-volatile memory; and
a controller comprising a transfer buffer and an error checking and correction (ECC) engine, wherein the controller controls the non-volatile memory, and wherein the controller is operable to:
write a lower page data from a transfer buffer to the non-volatile memory;
store in the transfer buffer an upper page data received from a host, subsequent, to writing the lower page data to the non-volatile memory;
read the lower page data from the non-volatile memory to store in the transfer buffer as an error corrected lower page data, subsequent to storing the upper page data in the transfer buffer, wherein the error corrected lower page data is stored in the transfer buffer in addition to the upper page data that is already stored in the transfer buffer;
write the error corrected lower page data to the non-volatile memory from the transfer buffer that stores both the error corrected lower page data and the upper page data; and
write the upper page data stored in the transfer buffer to the non-volatile memory, subsequent to writing the error corrected lower page data to the non-volatile memory from the transfer buffer that stores both the error corrected lower page data and the upper page data.

11. The apparatus of claim 10, wherein the non-volatile memory is a NAND memory, and wherein the transfer buffer has adequate storage capacity to accommodate both the lower page data and the upper page data at the same time.

12. The apparatus of claim 11, and wherein:
the controller receives the upper page data from the host subsequent to receiving the lower page data from the host;
the received lower page data is written to the NAND memory prior to receiving the upper page data from the host; and
reading of the lower page data written to the NAND memory is needed to write the upper page data to the NAND memory.

13. The apparatus of claim 11, wherein the host writes data comprising the lower page data and the upper page data to the apparatus by first transmitting the lower page data and then transmitting the upper page data to the controller of the apparatus, and wherein the non-volatile memory corresponds to a triple level cell (TLC) NAND.

14. The apparatus of claim 11, wherein the error correcting of the lower page data in the controller is performed via the ECC engine to reduce misplacement errors in the apparatus, and wherein misplacement errors caused by read errors of the lower page data are reduced by reading and correcting the lower page data by the controller, and subsequently writing the error corrected lower page data followed by upper page data to the NAND memory.

15. An apparatus, comprising:
a NAND complex comprising one or more NAND page buffers and a NAND memory; and
a controller comprising a transfer buffer and an error checking and correction (ECC) engine, wherein the controller controls the NAND complex, and wherein the controller is operable to:
receive a lower page data from a host and write the lower page data into the NAND memory;
load from a transfer buffer of the controller, in one or more NAND page buffers of the NAND complex, an upper page data received from the host, subsequent to writing the lower page data into the NAND memory;
read the lower page data from the NAND memory to store in the transfer buffer of the controller as an error corrected lower page data, wherein the transfer buffer on storing the error corrected lower page data no longer has the upper page data, subsequent to loading the upper page data in the one or more NAND page buffers; and
load the error corrected lower page data to the one or more NAND page buffers, subsequent to storing the error corrected lower page data in the transfer buffer; and
program the writing of the upper page data and the error corrected lower page data from the one or more NAND page buffers into the NAND memory, subsequent to loading the error corrected lower page data to the one or more NAND page buffers.

16. The apparatus of claim 15, wherein storage capacity requirements of the transfer buffer is reduced because the transfer buffer does not have to accommodate both the lower page data and the upper page data at the same time, and wherein:
the controller receives the upper page data from the host subsequent to receiving the lower page data from the host;
the received lower page data is written to the NAND memory prior to receiving the upper page data from the host; and
reading of the lower page data written to the NAND memory is needed to write the upper page data to the NAND memory.

17. The apparatus of claim 15, wherein the host writes data comprising the lower page data and the upper page data to the apparatus by first transmitting the lower page data and then transmitting the upper page data to the controller of the apparatus, and wherein the NAND complex is a triple level cell (TLC) NAND.

18. The apparatus of claim 15, wherein error correcting of the lower page data in the controller is performed via the ECC engine, and wherein misplacement errors caused by read errors of the lower page data are reduced by the reading and the error correcting of the lower page data by the controller, and subsequently writing the error corrected lower page data and the upper page data to the NAND memory.

19. The apparatus of claim 15, the apparatus further comprising:
a NAND device, comprising:
a plurality of NAND page buffers; and
a NAND array comprised of a plurality of NAND memory elements including the NAND memory, wherein the NAND device is configured to store incoming page data to a NAND page buffer of the plurality of NAND page buffers, and then allow read operations to the NAND array, and then allow further transfer of read data to the controller, without corrupting any incoming page data stored in the NAND page buffer.

20. The method of claim 1, wherein the non-volatile memory is comprised of a triple level cell (TLC) NAND, the method further comprising:
performing error correction of the upper page data during programming of an extra page data in the TLC NAND, wherein both error corrected upper page data and the extra page data are stored in the transfer buffer.

21. The method of claim 6, wherein the NAND memory is comprised of a triple level cell (TLC) NAND, the method further comprising:
performing error correction of the upper page data during programming of an extra page data in the TLC NAND.

22. The apparatus of claim 10, wherein the non-volatile memory is comprised of a triple level cell (TLC) NAND, wherein the controller is further operable to:
perform error correction of the upper page data during programming of an extra page data in the TLC NAND, wherein both error corrected upper page data and the extra page data are stored in the transfer buffer.

23. The apparatus of claim 15, wherein the NAND memory is comprised of a triple level cell (TLC) NAND, wherein the controller is further operable to:
perform error correction of the upper page data during programming of an extra page data in the TLC NAND.

* * * * *